United States Patent
Blayvas

(10) Patent No.: US 11,625,820 B2
(45) Date of Patent: Apr. 11, 2023

(54) EVALUATING AN INSPECTION ALGORITHM FOR INSPECTING A SEMICONDUCTOR SPECIMEN

(71) Applicant: Applied Materials Israel Ltd., Rehovot (IL)

(72) Inventor: Ilya Blayvas, Jerusalem (IL)

(73) Assignee: Applied Materials Israel Ltd., Rehovot (IL)

( * ) Notice: Subject to any disclaimer, the term of this patent is extended or adjusted under 35 U.S.C. 154(b) by 171 days.

(21) Appl. No.: 16/885,763

(22) Filed: May 28, 2020

(65) Prior Publication Data
US 2021/0374935 A1 Dec. 2, 2021

(51) Int. Cl.
G06T 7/00 (2017.01)
G01N 21/95 (2006.01)
G01N 21/88 (2006.01)

(52) U.S. Cl.
CPC ....... *G06T 7/0004* (2013.01); *G01N 21/8806* (2013.01); *G01N 21/9501* (2013.01); *G06T 2207/30148* (2013.01)

(58) Field of Classification Search
CPC ........ G06T 7/0004; G06T 2207/30148; G01N 21/8806; G01N 21/9501
USPC .......................................................... 382/145
See application file for complete search history.

(56) References Cited

U.S. PATENT DOCUMENTS

| | | | |
|---|---|---|---|
| 7,139,997 B1 * | 11/2006 | Rahim ................. | G06F 30/398 716/51 |
| 8,687,221 B1 * | 4/2014 | Bergmans ............ | G06F 3/1288 358/1.9 |
| 2014/0165137 A1 | 6/2014 | Balinsky et al. | |
| 2014/0270475 A1 * | 9/2014 | Huang ................. | G06T 7/0004 382/149 |
| 2016/0011952 A1 | 1/2016 | Tajerina et al. | |
| 2018/0106732 A1 * | 4/2018 | Plihal ................... | G01N 21/55 |

FOREIGN PATENT DOCUMENTS

| | | | | |
|---|---|---|---|---|
| CN | 104217201 A | * | 12/2014 | ............ G06K 9/036 |
| CN | 107025157 A | * | 8/2017 | ......... G06F 11/2273 |
| DE | 102015217181 A1 | * | 3/2017 | ............ H05K 13/08 |
| WO | 2015/200510 A1 | | 12/2015 | |

* cited by examiner

*Primary Examiner* — Roy M Punnoose
(74) *Attorney, Agent, or Firm* — Kilpatrick Townsend & Stockton LLP

(57) ABSTRACT

A method, a non-transitory computer readable medium, and a system for evaluating an inspection algorithm for inspecting a semiconductor specimen.

6 Claims, 9 Drawing Sheets

EVALUATING AN INSPECTION ALGORITHM FOR INSPECTING A SEMICONDUCTOR SPECIMEN

BACKGROUND

Semiconductor manufacturers do manufacture semiconductor specimens using state of the art inspection systems. Examples of state of the art inspection systems include the UVISION™ family of inspection systems of Applied Materials Inc., Santa Clara, Calif., USA.

The inspection systems are configured to execute inspection algorithms during the inspection of the semiconductor specimens. An inspection algorithm may determine one or more aspects of the detection process—such as an illumination of the semiconductor specimens, a collecting of radiation from the semiconductor specimens, a processing of detection signals that represent the radiation emitted from the semiconductor specimens, and any mechanical aspect of the inspection process.

The inspection systems are usually located at semiconductor manufacturing plants (also known as fabs), and the inspection results generated by the inspection systems are one of the most valuable assets of the semiconductor manufacturers.

The inspection results are heavily guarded by the semiconductor manufacturers. Especially—access to the inspection results is usually strictly limited to the semiconductor manufacturers themselves. The inspection results may include images of the inspected semiconductor specimens.

Various semiconductor specimen defects are relatively rare. In order to develop an optimal inspection algorithm, a developing entity (for example a developers and/or developing teams of an inspection system manufacturor) may require thousands of images—and even more than one million images—especially when the inspection algorithm is developed using, at least in part, machine learning processes.

Nevertheless—the developing entities are not allowed to access the inspection results. Accordingly—in many cases, the inspection algorithms developed by the developing entities are sub-optimal.

A high cost is associated with inspection failures and/or manufacturing process failures resulting from an inaccurate inspection.

There is also a risk of applying sub-optimal inspection algorithms or otherwise untrusted inspection algorithms in the inspection systems.

The mentioned above high cost and risk may intimidate semiconductor manufacturers from implementing newly developed inspection algorithms on their inspection systems.

Semiconductor manufacturers usually control the manufacturing process by monitoring a baseline of the defects in the semiconductor manufacturing plant. An implementation of a new inspection algorithm may disrupt the baseline. The disruption may introduce an uncertainty of whether the baseline was changed due to the implementation of the new inspection algorithm, or due to a change in the manufacturing process—or due to both reasons.

It is impractical to mitigate the uncertainty by applying both current inspection algorithms and new inspection algorithms on the inspection systems—due to its high cost and reduction in manufacturing process throughput.

There is a growing need to provide a solution that is efficient, reliable, and does not expose the inspection results to the developing entities.

SUMMARY

There may be provided a method, a non-transitory computer readable medium and a system for evaluating an inspection algorithm for inspecting a semiconductor specimen.

BRIEF DESCRIPTION OF THE DRAWINGS

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings in which:

DETAILED DESCRIPTION

Figure 1:
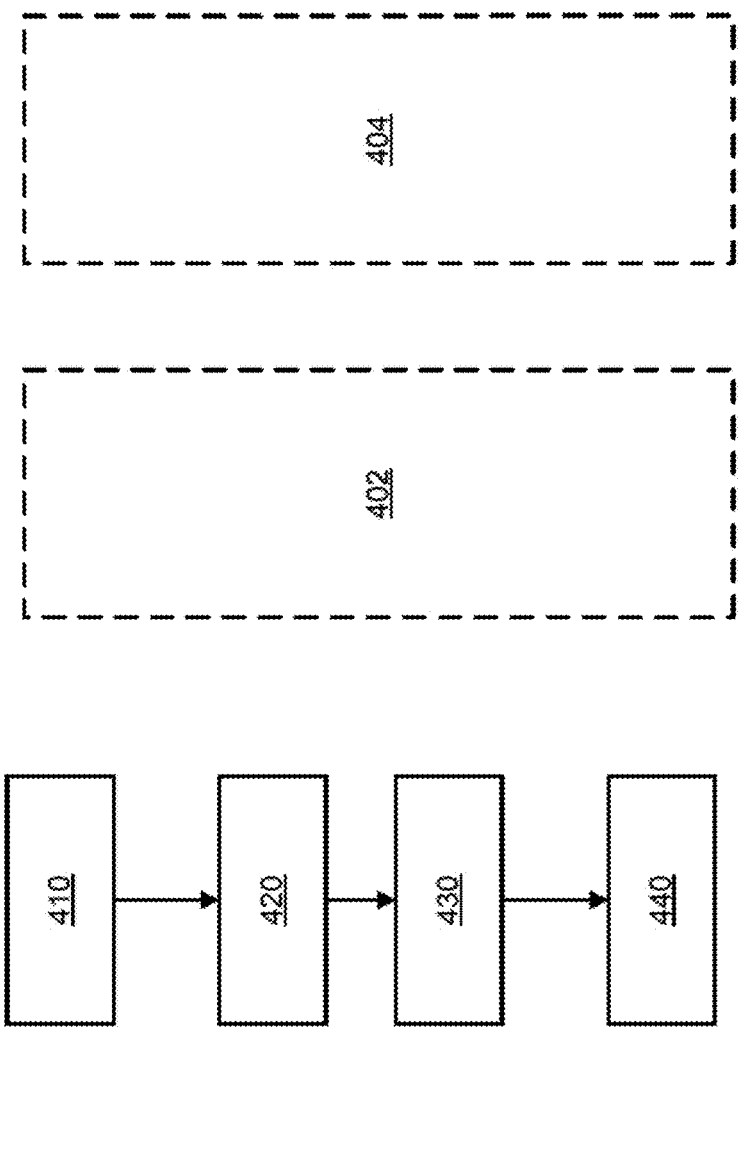
FIG. 1 illustrates an example of a method for evaluating an inspection algorithm for inspecting a semiconductor specimen.

In the following detailed description, numerous specific details are set forth in order to provide a thorough understanding of the embodiments of the disclosure.

However, it will be understood by those skilled in the art that the present embodiments of the disclosure may be practiced without these specific details. In other instances, well-known methods, procedures, and components have not been described in detail so as not to obscure the present embodiments of the disclosure.

The subject matter regarded as the embodiments of the disclosure is particularly pointed out and distinctly claimed in the concluding portion of the specification. The embodiments of the disclosure, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the disclosure may for the most part, be implemented using electronic components and circuits known to those skilled in the art, details will not be explained in any greater extent than that considered necessary as illustrated above, for the understanding and appreciation of the underlying concepts of the present embodiments of the disclosure and in order not to obfuscate or distract from the teachings of the present embodiments of the disclosure.

Any reference in the specification to a method should be applied mutatis mutandis to a system capable of executing the method and should be applied mutatis mutandis to a computer readable medium that is non-transitory and stores instructions for executing the method.

Any reference in the specification to a system should be applied mutatis mutandis to a method that may be executed by the system and should be applied mutatis mutandis to a computer readable medium that is non-transitory and stores instructions executable by the system.

Any reference in the specification to a computer readable medium that is non-transitory should be applied mutatis mutandis to a method that may be applied when executing instructions stored in the computer readable medium and should be applied mutatis mutandis to a system configured to execute the instructions stored in the computer readable medium.

The term "and/or" means additionally or alternatively.

Any reference to the term "may be" should be applied mutatis mutandis to the term "may not be".

A "few" may be one, two, three, four, and the like.

The terms "tilt" and "deflection" are used in an interchangeable manner.

The specification and/or drawings may refer to a processor. The processor may be a processing circuitry. The processing circuitry may be implemented as a central processing unit (CPU), and/or one or more other integrated circuits such as application-specific integrated circuits (ASICs), field programmable gate arrays (FPGAs), full-custom integrated circuits, etc., or a combination of such integrated circuits.

The specification may refer to an inspection algorithm. Any reference to an inspection algorithm may be applied mutatis mutandis to multiple inspection algorithms, an/or may be applied mutatis mutandis to any other algorithm to be executed by any evaluation system such as a metrology machine, a review machine, and the like.

When multiple inspection algorithms are evaluated then a selection between the multiple inspection algorithms can be made. Additionally or alternatively—different inspection algorithms may be allocated to different situations. This selection and/or allocating can be done by the evaluator, can be done by a member of the semiconductor manufacturing plant, or can be done, at least in part, without human intervention.

FIG. 1 illustrates an example of method 400 for evaluating an inspection algorithm for inspecting a semiconductor specimen.

Method 400 may start by step 410 of receiving, by an evaluation unit, the inspection algorithm. The inspection algorithm is developed by a developing entity. The inspection algorithm may be referred to as a new inspection algorithm—in the sense that it is not currently executed by the inspection system.

The evaluation unit may be a part of the inspection system. Alternatively, the evaluation unit may not belong to the inspection system.

Step 410 may be followed by step 420 of obtaining, by the evaluation unit, at least portions of inspection results related to multiple semiconductor specimens inspected by an inspection system. An inspection results may include inspection results of multiple wafers that were inspected over any period of time—less than an hour, an hour, more than an hour, less than a day, a day, more than a day, less than a week, a week, more than a week, less than a month, a month, more than a month, less than a year, a year, and even more than a year.

The multiple semiconductor specimens may belong to one or more batches.

The at least portions of inspection results may be provided by multiple inspection systems. It is assumed, for simplicity of explanation, that the inspection results are provided by a single inspection system.

Each inspection result may be or may include a very high-resolution image. The very high resolution may be a resolution of a sub-micron scale. Each image may cover an area of a wafer—whereas the area is usually a small fraction of the entire wafer. The overall size of images taken of areas of the same wafer may be very large—may include trillions may exceed tens of terabytes.

The inspection results may include additional data (for example—may include attributes, metadata, measurements, and the like) or may include both images and additional data.

Step 420 may include obtaining the entire images or obtaining only parts of the images. For example—information regarding only some areas of the wafer may be sent to the evaluation unit.

The size of the parts of the images may be a trade-off between (a) storage resources and communications resources required to store and communicate the parts of the images, and (b) the odds of missing a part of an image that includes a significant defect.

Any trade-off may be applied. The trade-off may consider the expected probability of encountering the defect, the number of available storage resources, the criticality of the defect, the importance of the defect, and the number of images expected to be acquired.

The parts of the images may be conveyed to the evaluation unit over one or more local communication paths. Due to the large size of the parts of the images, using wired connections may be beneficial.

Step 420 may be followed by step 430 of evaluating, by the evaluation unit and within a sandbox testing environment, the inspection algorithm to provide evaluation results.

The evaluation results may be represented by an indication that may include at least one out of (a) a trust level of the inspection algorithm, (b) any other information regarding the performance of the inspection algorithm—for example time of execution, usage of computation resources, usage of memory resources, accuracy, repeatability, resolution, any type of error, false detection of a suspected defect, true detection of a suspected defect, missing a defect, and the like—the information may be of any granularity—from performance regarding the entire type of suspected defects to performance regarding certain defects or certain classes of defects. The indication may be designed by the evaluator.

The sandbox testing environment isolates the inspection system from the evaluation of the inspection algorithm—and prevents the inspection system to be adversely affected by the execution of step 430. Any solution that isolated the new evaluation of the inspection algorithm from the inspection system may be regarded as a sandbox testing environment.

The sandbox testing result may be (see www.wikipedia.org) a testing environment that isolates untested code changes and outright experimentation from the production environment or repository.

Step 430 may include applying the inspection algorithm on the at least portions of inspection results related to multiple semiconductor specimen.

Step 430 may be followed by step 440 of sending to the developing entity at least an indication regarding the evaluation results.

Method 400 is executed without exposing, to the developing entity, the at least portions of the inspection results related to the multiple semiconductor specimens.

This is illustrated by step 402 of preventing, from the developing entity, access to the at least portions of the inspection results.

Step 430 may be executed in parallel, in a partially overlapping manner, or in a non-overlapping manner with the executing, by an inspection system, an inspection process—by applying a current inspection algorithm.

The executing, by an inspection system, of an inspection process—by applying a current inspection algorithm is illustrated by step 404. The execution of the inspection process (by executing of the current inspection algorithm) should not be interrupted by the evaluation of the inspection algorithm by the evaluation unit. For example—the execution of steps 402, 410, 420, 430 and 440 should not affect the throughput of step 404, should not affect the outcome of the execution of step 404, and the like.

It should be noted that while steps 410, 420, 430 and 440 are related to an evaluation of an inspection algorithm (new inspection algorithm or evaluated inspection algorithm), step 404 is related to the execution of a current inspection algorithm—and may not be included in method 400.

Figure 2:
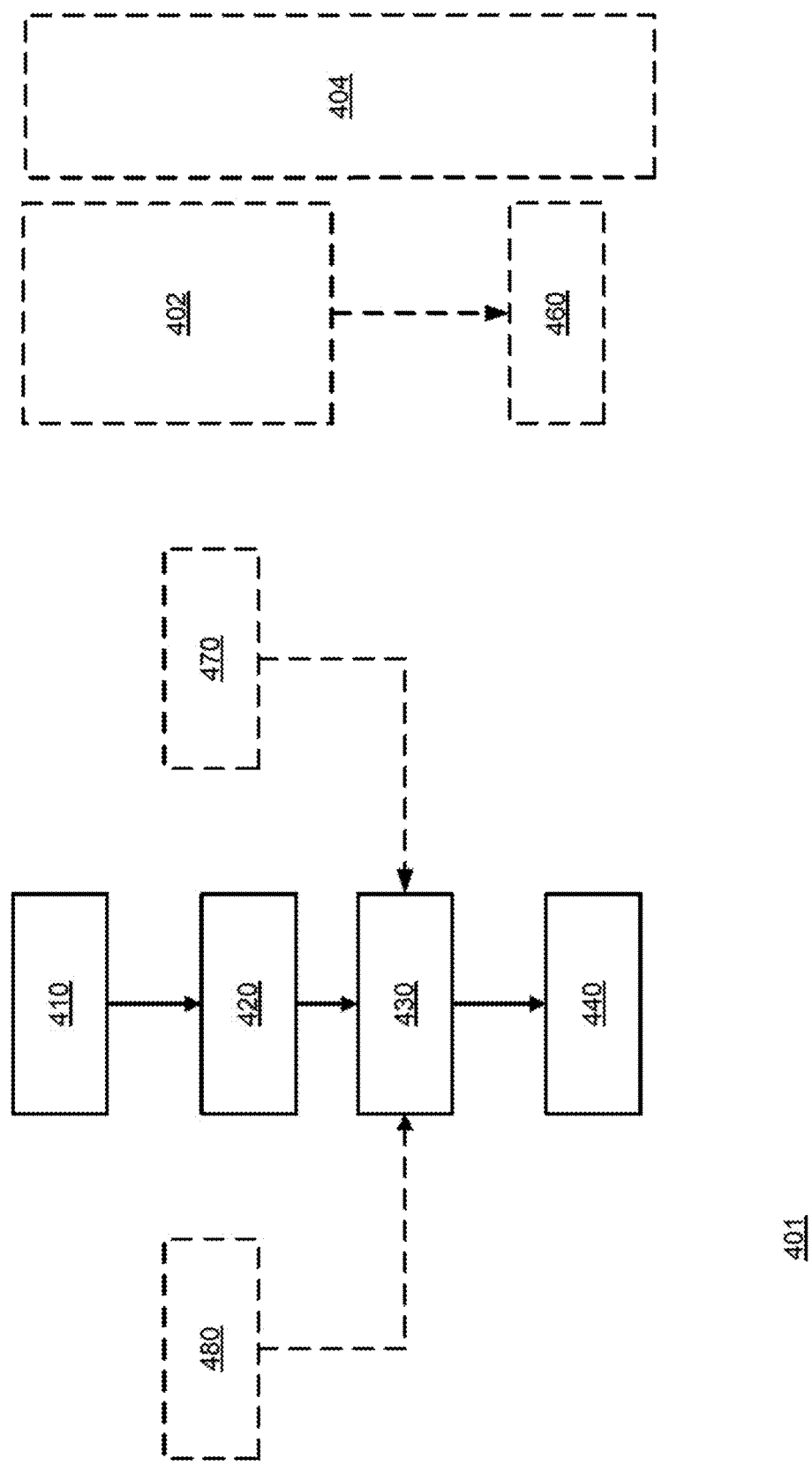
FIG. 2 illustrates an example of a method for evaluating an inspection algorithm.

FIG. 2 illustrates an example of method 401.

Method 401 includes steps 402, 404, 410, 420, 430 and 440 of method 400.

In addition—method 401 may include at least one of additional steps 460, 470 and 480.

Step 402 may include executing, by an inspection system, an inspection process. Step 402 may include applying a current inspection algorithm Step 402 may be followed by step 460 of outputting at least one out of (a) the inspection results, (b) certain portions of the inspection results, and (b) any representation of the inspection results to a trusted entity—such as another system of the semiconductor manufacturing plants. The trusted entity may be, for example, another evaluation system such as a review tool, a management system or monitoring system of the semiconductor manufacturing plant or of the semiconductor manufacturer.

Step 470 may include receiving by the evaluation unit, review results of a review process that was applied on at least some of the multiple semiconductor specimens.

Step 470 may be followed by step 430. Accordingly—step 430 may include evaluating the inspection algorithm, whereas the evaluation is based, at least in part, on the review results.

Step 480 may include receiving by the evaluation unit trusted inspection results. Step 480 may be followed by step 430. Accordingly—step 430 may include evaluating the inspection algorithm, whereas the evaluation is based, at least in part, on the trusted inspection results.

FIGS. 3, 4, 5, 6 and 7 illustrate a developer 10, an evaluation unit 25, an inspection system 29 and their environment.

Figure 3:
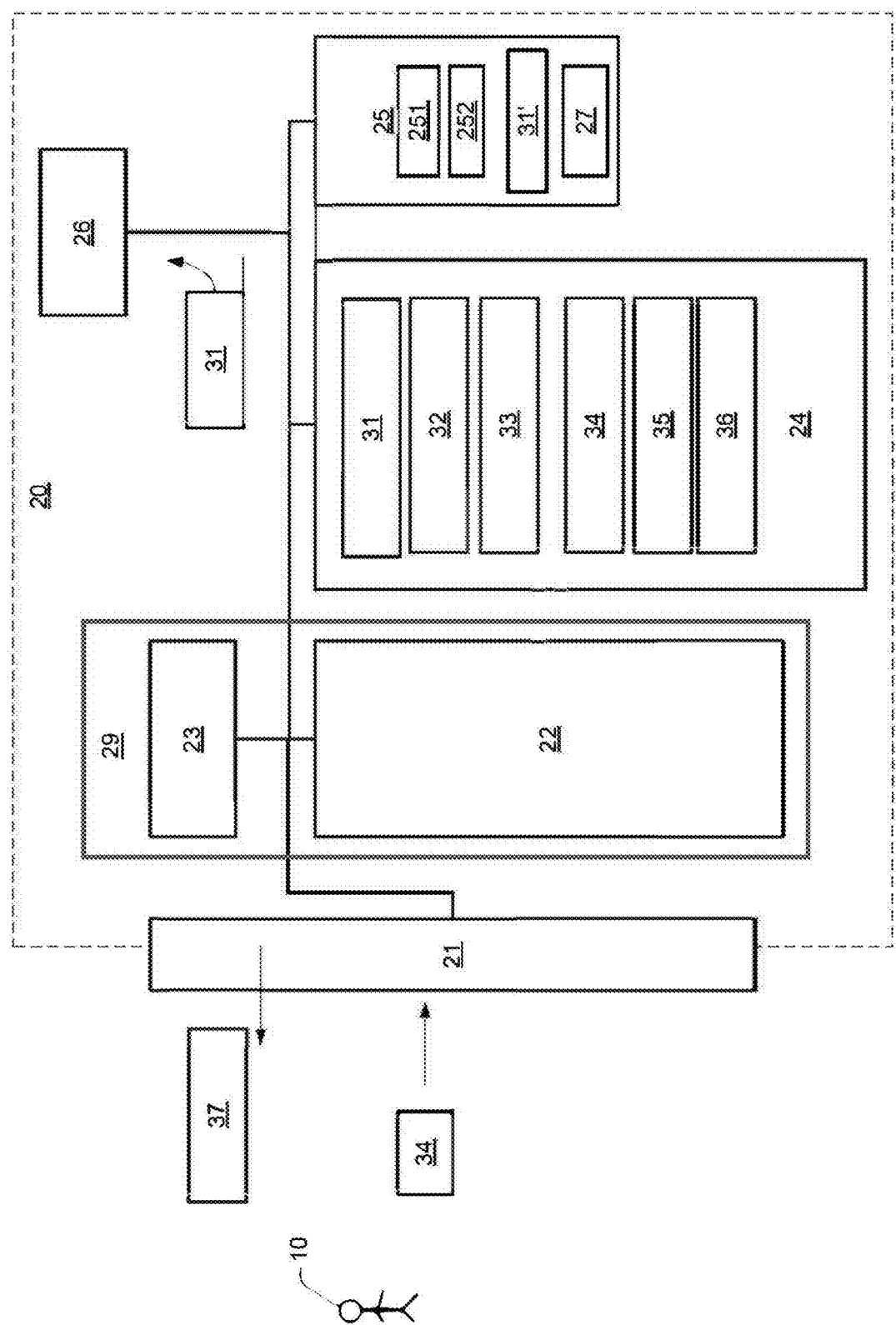
FIG. 3 illustrates a developer, an evaluation unit, an inspection system, and their environment.
Figure 4:
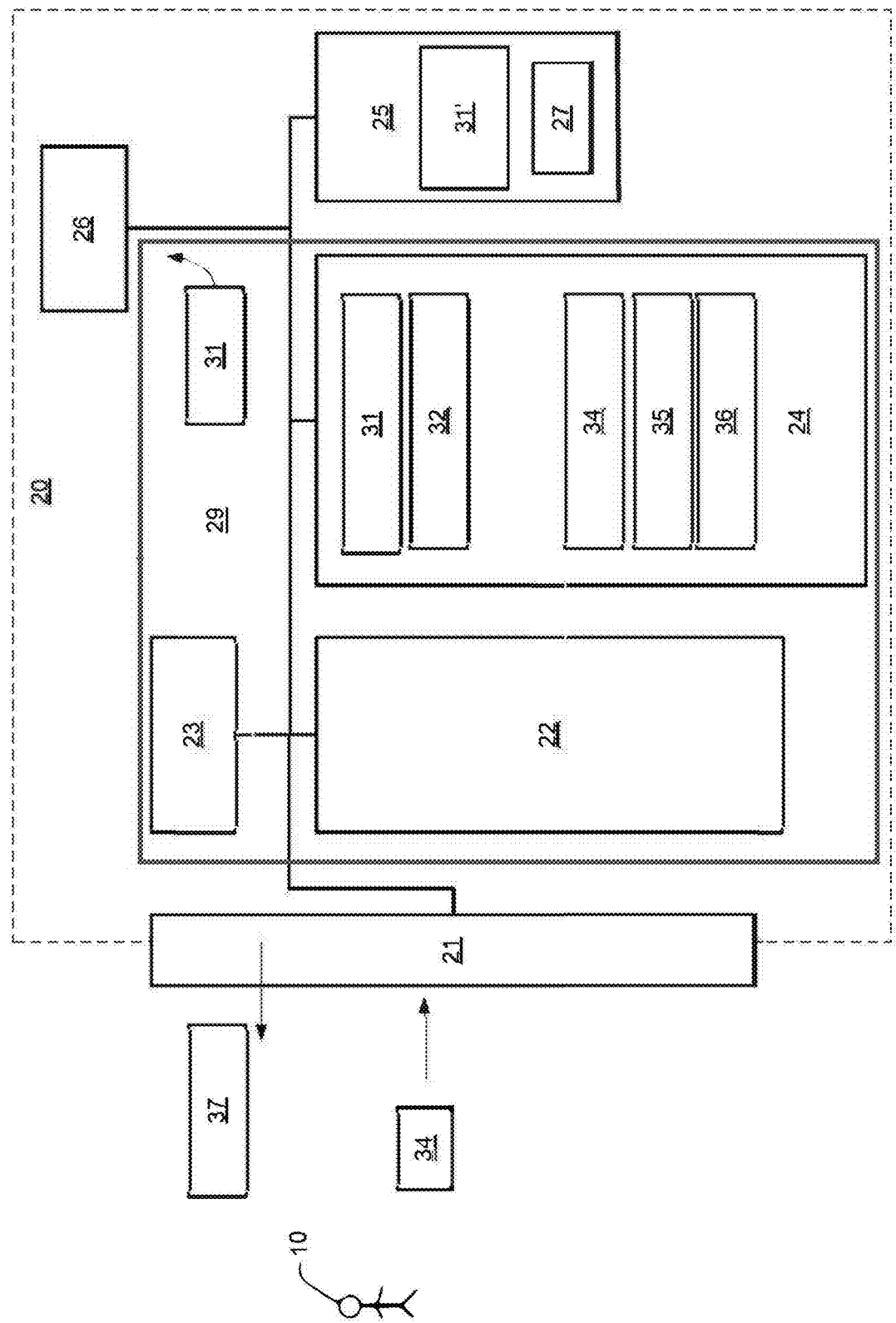
FIG. 4 illustrates a developer, an evaluation unit, an inspection system, and their environment.
Figure 5:
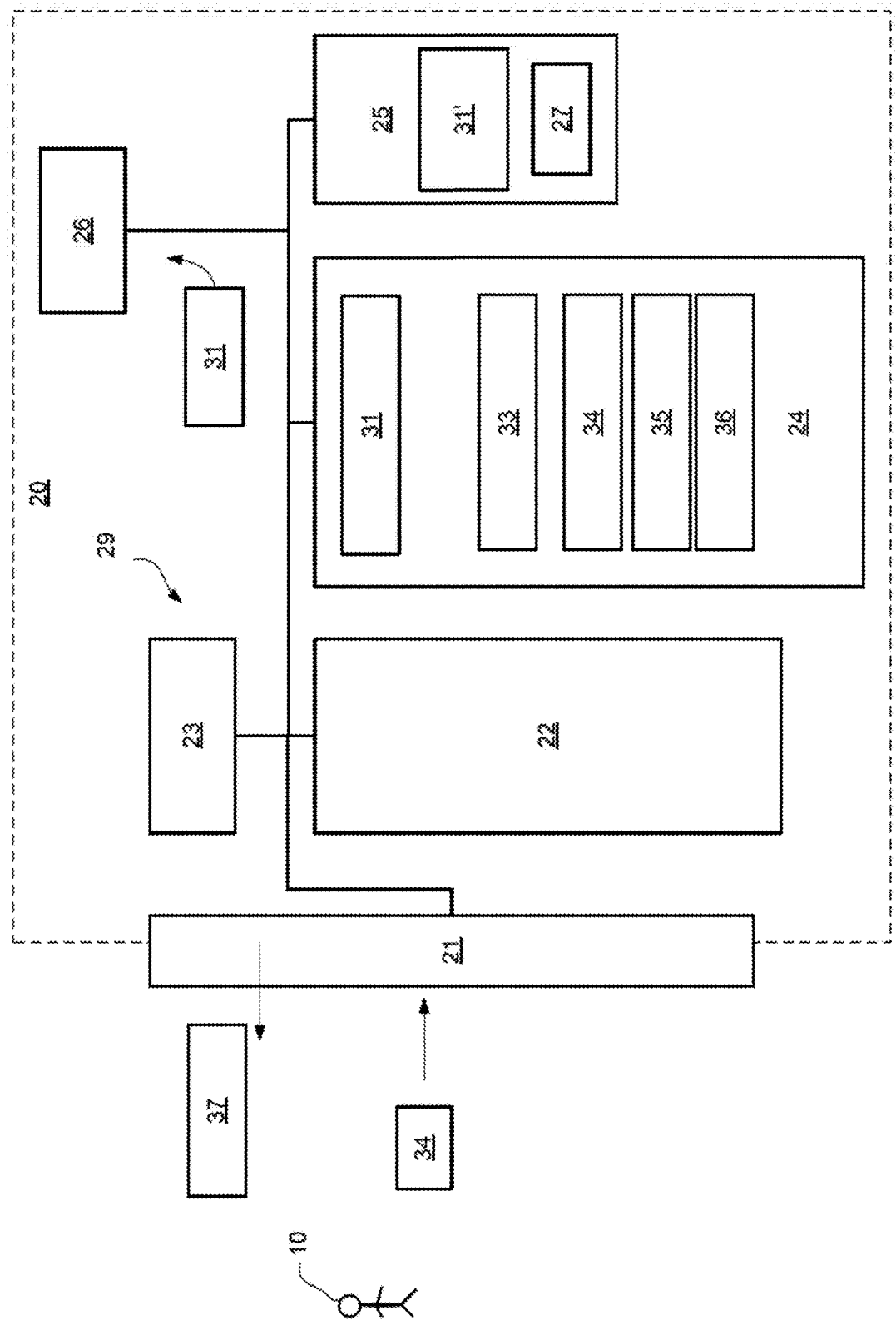
FIG. 5 illustrates a developer, an evaluation unit, an inspection system, and their environment.

FIG. 3 illustrates a firewall 21 or any other cybersecurity element that prevents unauthorized access of the developer 10 to the semiconductor manufacturing plant 20. Especially—the developer 10 is prevented from accessing the inspection results 31.

The firewall may be included in an input/output unit (not shown) of the semiconductor manufacturing plant, or may precede of follow the input/output unit of the semiconductor manufacturing plant.

The developer 10 may send the inspection algorithm 34 to the evaluation unit 25 directly or indirectly. An indirect provision of the inspection algorithm 34 may involve sending the inspection algorithm 34 to an intermediate entity (such as person or device) that may determine whether to send the inspection algorithm 34 to the evaluation unit. The person or device may be authorized by the semiconductor manufacturing plant to make such a decision.

The input/output unit may be any suitable communications component such as a network interface card, universal serial bus (USB) port, disk reader, modem or transceiver that may be operative to use protocols such as are known in the art to communicate either directly, or indirectly, with other elements of the semiconductor manufacturing plant and/or other entities.

The semiconductor manufacturing plant 20 is illustrated as including inspection system 29, and other systems 26 such as a review system, another inspection system, a management system, and the like.

The inspection system 29 may include an imager 22 and an inspection results generation unit 23. The imager 22 may illuminate wafers and obtain imager of the wafer or other detection signals. The inspection system 29 may include any other combination of optics, detector and processors to generate detection signals (even not images) related to semiconductor specimens.

The inspection results generation unit 23 may process the images to detect suspected defects. The inspection results generation unit 23 may include one or more processors.

It should be noted that the inspection system 29 may execute a current inspection algorithm to inspect the one or more semiconductor specimens.

FIG. 3 also illustrates storage unit 24 that may store at least some of the various code and data listed below—inspection results 31 (generated by the inspection system 29), review results 32, trusted inspection results 33, inspection algorithm 34, current inspection algorithm 35 (currently used to inspect semiconductor specimen), and evaluation results 36 (evaluating the inspection algorithm).

The storage unit 24 may store only some of these various code and data, may store other data and/or other code. For example—in FIGS. 4, 5 and 7 only some of these various code and data are stored in the storage unit 24.

The review results 32 may be provided by a review system such as a scanning electron microscope, and the like. The review results 32 may be used to evaluate the inspection algorithm—for example indicate which suspected defects that were found by the inspection algorithm were actually defects, which actual defects were not flagged as suspicious defects by the inspection algorithm, and the like.

The trusted inspection results 33 are inspection results that benefit from a higher trust level than the inspection results of the inspection system. They may be generated by an inspection system that has a higher level of trust (for example more accurate) that inspection system 29, they may be generated using an inspection algorithm that may be more reliable that the current inspection results, and the like. The trusted inspection results 33 may be used to evaluate the inspection algorithm.

The storage unit 24 may belong to inspection system 29, may not belong to inspection system 29 or may only partially belong to inspection system 29.

FIG. 3 also illustrates evaluation unit 25 as including sandbox testing environment 27. The evaluation unit 25 may access at least a part of the inspection results 31 stored within storage unit 24 or may have a copy (for example a cloned copy) of at least a part 31' of the inspection results.

In FIG. 3, the evaluation unit is illustrated as including a processor 251 and a memory unit 252. The memory unit 252 may store evaluation instructions for evaluating the inspection algorithm, may store the at least a part 31' of the inspection results, and the like. The processor 251 may evaluate the inspection algorithm. The sandbox testing environment 27 may be maintained by the processor 251 and the memory unit 252.

An indication 37 regarding the outcome of the evaluation may be sent to developer 10. The indication may include at least one out of (a) a trust level of the inspection algorithm, (b) any other information regarding the performance of the inspection algorithm—for example time of execution, usage of computation resources, usage of memory resources, accuracy, repeatability, resolution, any type of error, false detection of a suspected defect, true detection of a suspected defect, missing a defect, and the like—the information may be of any granularity—from performance regarding the entire type of suspected defects to performance regarding certain defects or certain classes of defects. The indication may be designed by the evaluator.

Figure 6:
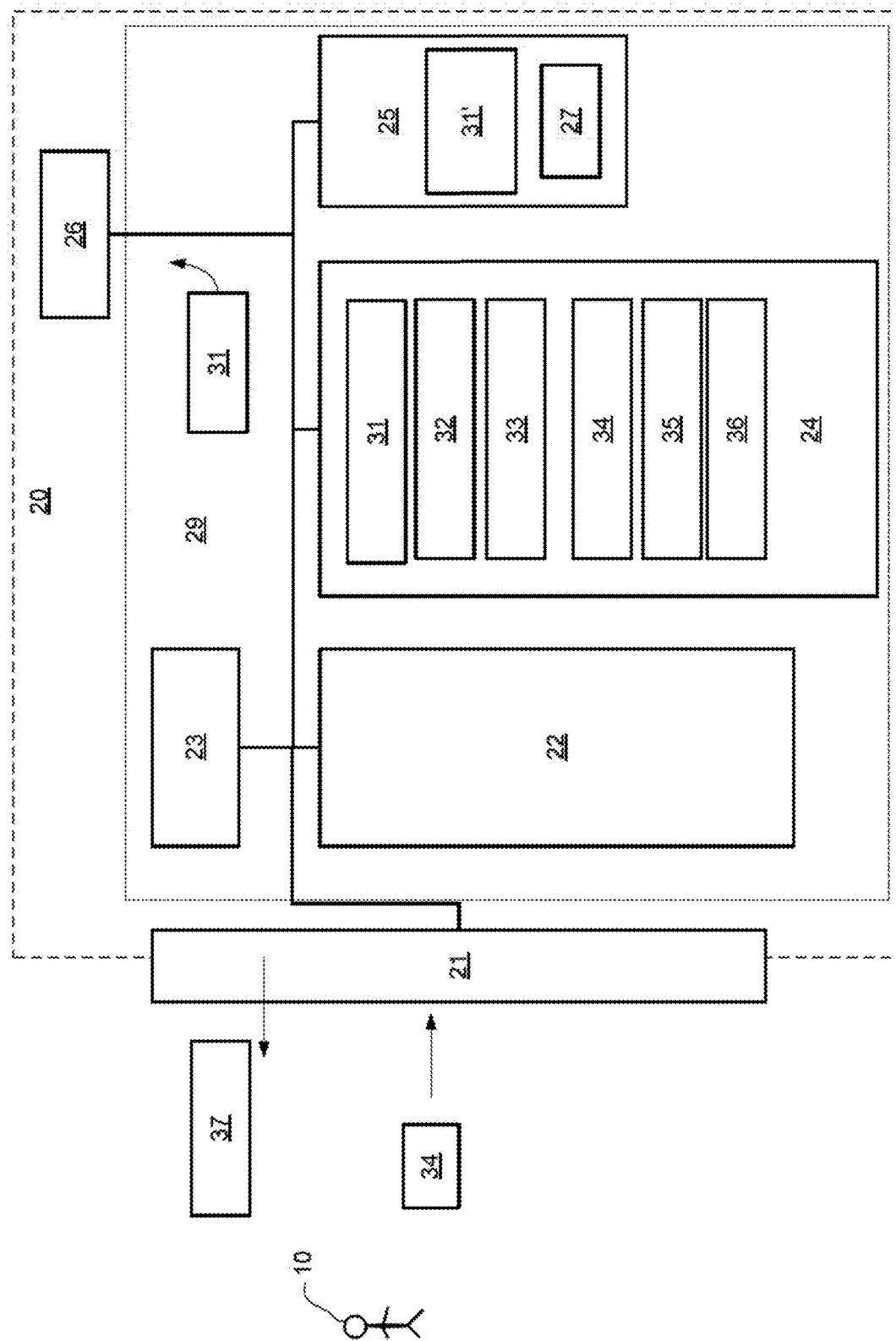
FIG. 6 illustrates a developer, an evaluation unit, an inspection system, and their environment.

FIG. 6 illustrates the inspection system 29 as including imager 22, inspection results generation unit 23, storage unit 24 and evaluation unit 25.

Figure 7:
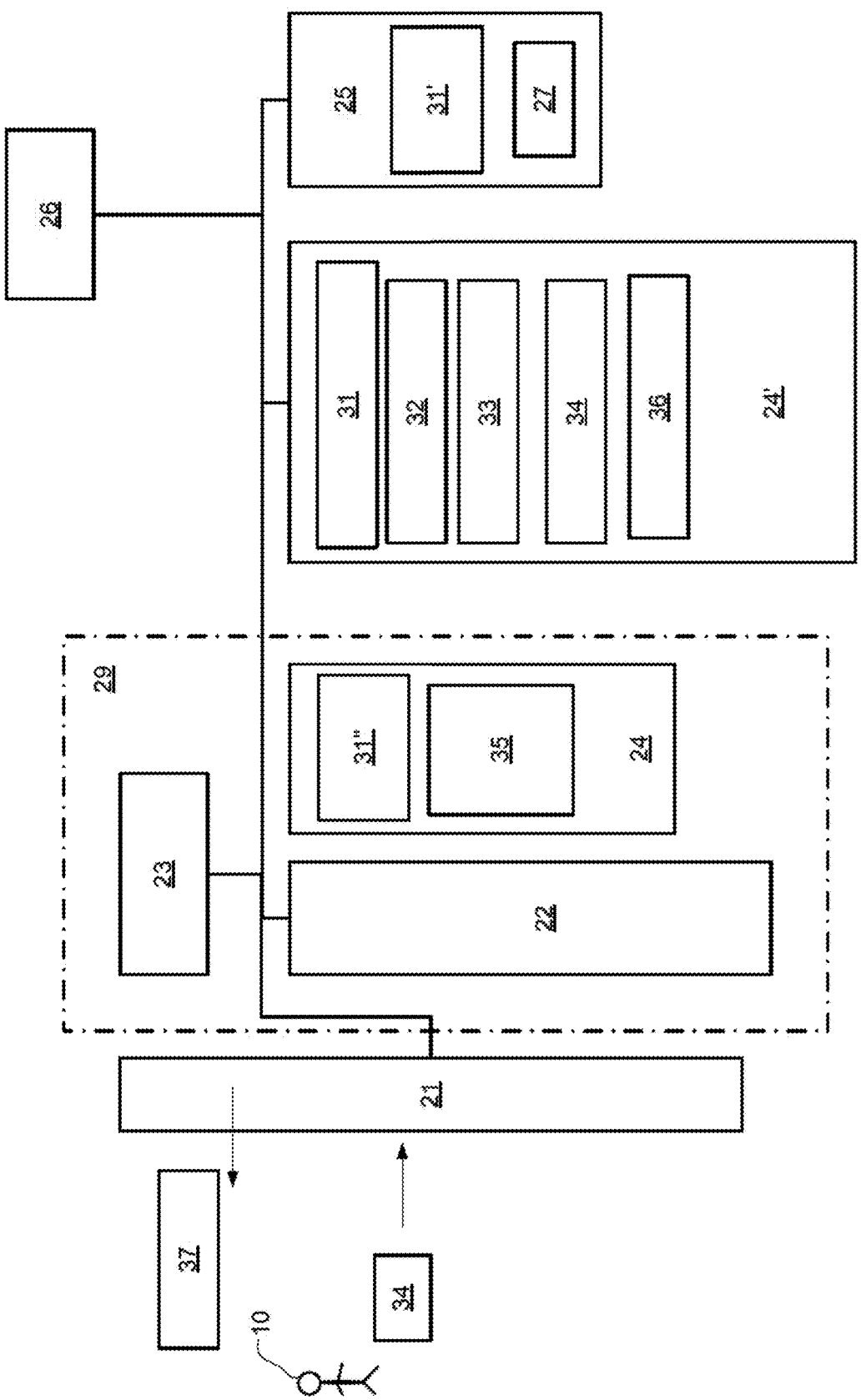
FIG. 7 illustrates a developer, an evaluation unit, an inspection system, and their environment.

FIG. 7 illustrates the inspection system 29 as including imager 22, inspection results generation unit 23, and a storage unit 24 that store some 31" of inspection results (for example the recent inspection results—as the inspection system may not be capable to store a large number of inspection results), and current inspection algorithm 35.

Another storage unit 24' stores various code and data such as inspection results 31, review results 32, trusted inspection results 33, inspection algorithm 34, and evaluation results 36.

The other storage unit 24', evaluation unit 25 and other systems 26 of FIG. 7 are not illustrated as being included in a semiconductor manufacturing plant 20. It should be noted that at least some of the systems and/or units illustrated in any one of FIGS. 3-7 that are shown as being a part of a semiconductor manufacturing plant 20—may be located outside the semiconductor manufacturing plant.

Figure 8:
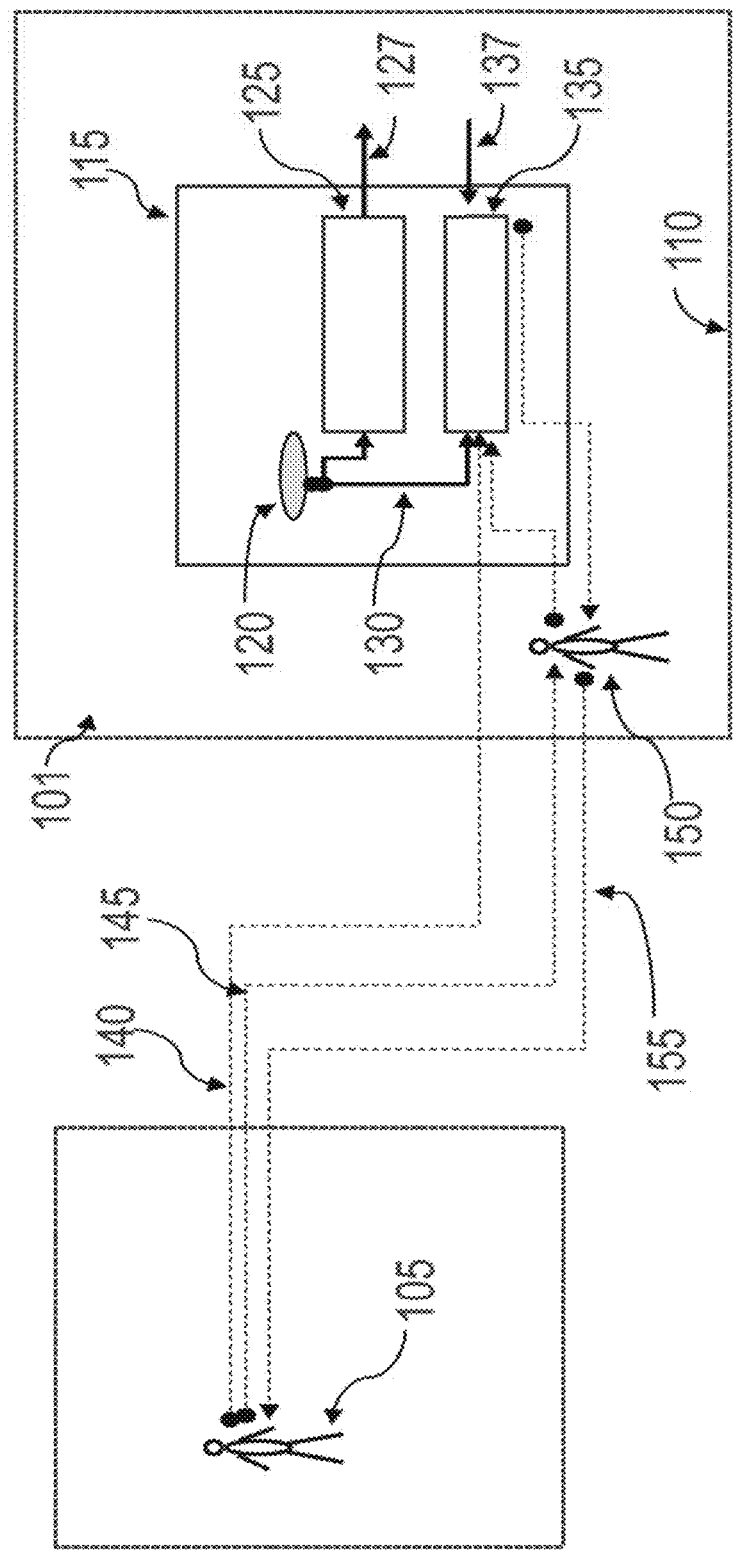
FIG. 8 illustrates an example of an algorithm developer and of a semiconductor manufacturing plant.

FIG. 8 illustrates an example of an algorithm developer 105 and of a semiconductor manufacturing plant 101.

Algorithm developer 105, works in his own environment, informationally isolated from the semiconductor manufacturing plant 101. The semiconductor manufacturing plant 101 protects its information by firewall 110. Inspection machine 115 is working in the semiconductor manufacturing plant, inspecting semiconductor specimens such as wafers 120. Images or other information obtained by scanning the wafers by an inspection system (optical, electronic microscope or other means) are sent to the processing unit 125, which analyzes the image or other information by searching for suspected defects or other information. The inspection results 127 may be sent to another entity of the semiconductor manufacturing plant. Other information 137 may also be received by the semiconductor manufacturing plant 101.

A part or all of the images or other information obtained by scanning the wafers may be is copied ('cloned') to information channel 130 and delivered to algorithm development module 135. The algorithm development module 135 may be organized in the form of a "sandbox" which means that any processes or failures that happen in this module do not interfere with the operation of the inspection machine 115 and its processing unit 125.

The algorithm development module 135 may be organized to receive and test one or more new inspection algorithms, sent by algorithm developer 105 (sent directly via e-mail or other interne connection made available by the firewall or via the assistance of an intermediate entity such as a semiconductor manufacturing plant personal 150).

The reception of a new inspection algorithm by the algorithm development module 135 does not violate the integrity of the firewall 110, since no information leaves the semiconductor manufacturing plant 101. The algorithm development module 135 is programmed to test the new inspection algorithm on the images or other information obtained by scanning the wafer.

The algorithm development module 135 may be configured to store the images or other information obtained by scanning the wafers and organize it into a local database accessible by the algorithm development module 135 to evaluate performance of the new inspection algorithm on selected subsets of the images or other information obtained by scanning the wafers.

The results 155 of the evaluation of the inspection algorithm are sent back to the algorithm developer 105 either directly via automatically parsed e-mail or other means drawn as route 140, or through the assistance of semiconductor manufacturing plant personal 150, drawn as route 145.

The integrity of the firewall 110 is not violated, since the images or other information obtained by scanning the wafers continue to be protected.

Figure 9:
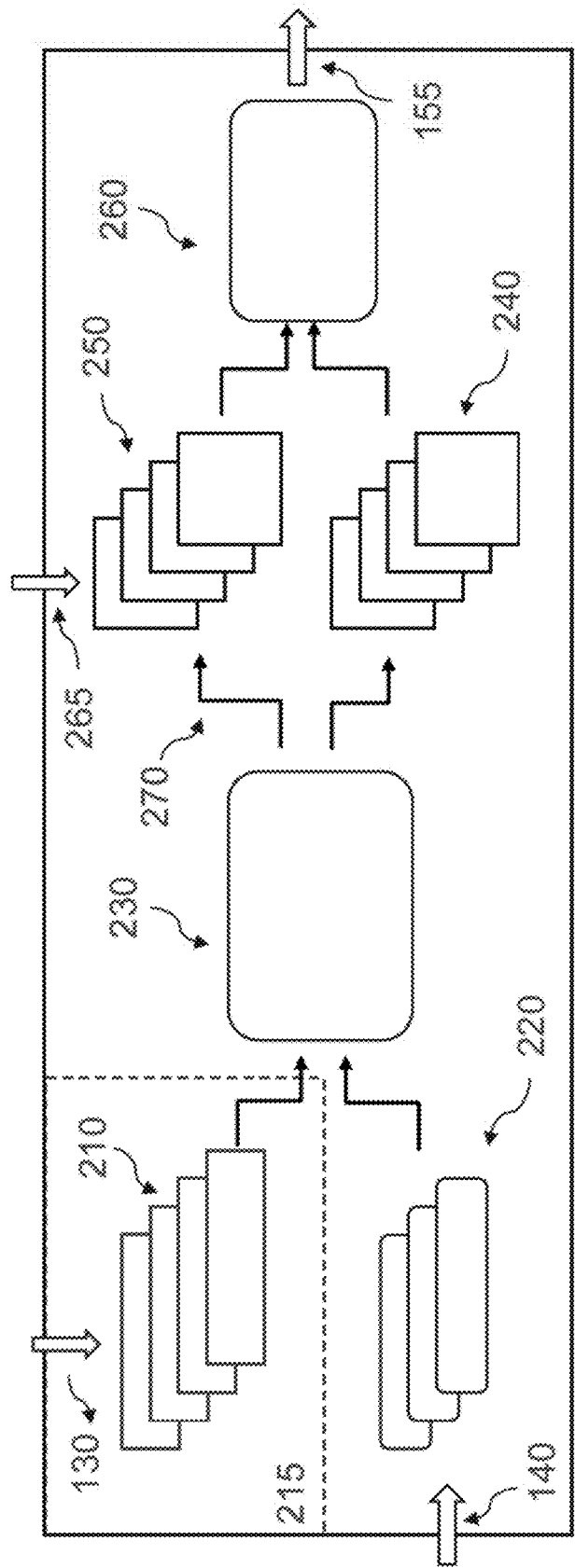
FIG. 9 is an example of an algorithm development module.

FIG. 9 is an example of an algorithm development module 135.

In this figure, images, parts of images or other information obtained by scanning a wafer form datasets. Different datasets may be generated from the inspection of one or more wafers.

Datasets 210 are maintained in the semiconductor manufacturing plant and are not exposed to the developer. The datasets may be obtained over information channel 130.

One or more inspection algorithms 220 are being evaluated by an algorithm development module 135. They may be received from algorithm developer via route 140 or another route (denoted 145 in FIG. 8).

Evaluation program 230 obtains an inspection algorithm (out of one or more inspection algorithms 220) and one or more datasets out of datasets 210, and evaluates the inspection algorithm by executing the inspection algorithm on the one or more datasets.

The evaluation results may be stored in a database of evaluation results 240.

The algorithm development module 135 may access 'ground truth' results 250 (such as trusted inspection results and/or review results). The review results may be obtained from a review system 265 (e.g. a defect review high-resolution scanning electron microscope). The trusted review results may be obtained by executing a trusted high-confidence inspection algorithm 270.

Unit 260 sends the evaluation results over a link to the algorithm developer (not shown) in any manner—including the one or more paths shown in FIG. 8.

A secret fire-walled area 215 of the customer's data includes, at least the datasets 210. The datasets may never leave the semiconductor manufacturing plant.

It should be noted that indexes of the dataset associated with the evaluation of the inspection information may be sent, and the evaluation results 240 or at least an indication of the evaluation results can be sent.

The indication may include a comparison with the 'ground truth' results 250, or any other information regarding the evaluation results.

In the foregoing specification, the embodiments of the disclosure has been described with reference to specific examples of embodiments of the disclosure. It will, however, be evident that various modifications and changes may be made therein without departing from the broader spirit and scope of the embodiments of the disclosure as set forth in the appended claims.

Any reference to the terms comprising or having should be applied mutatis mutandis to the terms consisting or "consisting essentially".

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to be a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to embodiments of the disclosure s containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the embodiments of the disclosure have been illustrated and described herein, many modifications, substitutions, changes, and equivalents will now occur to those of ordinary skill in the art. It is, therefore, to be understood that the appended claims are intended to cover all such modifications and changes as fall within the true spirit of the embodiments of the disclosure.

I claim:

1. A method for evaluating a new inspection algorithm for detecting defects on semiconductor wafers by an inspection system, the method comprising:
   receiving, by an evaluation unit of the inspection system, the new inspection algorithm; the new inspection algorithm developed by an inspection algorithm developer;
   storing, by a memory of the evaluation unit, images from multiple semiconductor wafers inspected by the inspection system using a current inspection algorithm different from the new inspection algorithm;
   evaluating, by a processor of the evaluation unit and within a sandbox testing environment of the inspection system that is isolated from a production environment of the inspection system, the new inspection algorithm to provide evaluation results; wherein the evaluating comprises applying the new inspection algorithm on the images from the multiple semiconductor wafers, and the evaluation results comprise detection of suspected defects within the images; and
   sending, from the evaluation unit to the inspection algorithm developer, at least an indication regarding the evaluation results, wherein the indication regarding the evaluation results includes a performance of the new inspection algorithm compared to the current inspection algorithm;
   wherein the storing, the evaluating, and the sending are executed without exposing, to the inspection algorithm developer, the images from the multiple semiconductor wafers.

2. The method according to claim 1 wherein the images are conveyed to the evaluation unit over one or more local communication paths.

3. The method according to claim 1, further comprising receiving, by the evaluation unit, review results of a review process that was applied on at least some of the multiple semiconductor wafers; and wherein the evaluating of the inspection algorithm is based, at least in part, on the review results.

4. The method according to claim 1 wherein the storing, the evaluating, and the sending are executed without interrupting an inspection process executed in the production environment of the inspection system.

5. A non-transitory computer readable medium for evaluating a new inspection algorithm for detecting defects on semiconductor wafers by an inspection system, the non-transitory computer readable medium stores instructions comprising:

receiving, by an evaluation unit of the inspection system, the new inspection algorithm; the new inspection algorithm developed by an inspection algorithm developer;

storing, by a memory of the evaluation unit, images from multiple semiconductor wafers inspected by the inspection system using a current inspection algorithm different from the new inspection algorithm;

evaluating, by a processor of the evaluation unit and within a sandbox testing environment of the inspection system that is isolated from a production environment of the inspection system, the new inspection algorithm to provide evaluation results; wherein the evaluating comprises applying the inspection algorithm on the images from multiple semiconductor wafers, and the evaluation results comprise detection of suspected defects within the images; and sending, from the evaluation unit to the inspection algorithm developer, at least an indication regarding the evaluation results, wherein the indication regarding the evaluation results includes a performance of the new inspection algorithm compared to the current inspection algorithm;

wherein the storing, the evaluating, and the sending are executed without exposing, to the inspection algorithm developer, the images from the multiple semiconductor wafers.

6. An inspection system for evaluating a new inspection algorithm for detecting defects on semiconductor wafers, the inspection system comprising an evaluation unit, wherein the evaluation unit comprises a memory unit and a processor that are configured to perform steps comprising:

receive the new inspection algorithm; the new inspection algorithm developed by an inspection algorithm developer;

store by the memory unit images from multiple semiconductor wafers inspected by the inspection system using a current inspection algorithm different from the new inspection algorithm;

evaluate by the processor of the evaluation unit and within a sandbox testing environment of the inspection system that is isolated from a production environment of the inspection system, the new inspection algorithm to provide evaluation results wherein the evaluating comprises applying the new inspection algorithm on the images from the multiple semiconductor wafers, and the evaluation results comprise detection of suspected defects within the images; and generate an indication regarding the evaluation results to be sent to the inspection algorithm developer without exposing, to the inspection algorithm developer, the images from the multiple semiconductor wafers, wherein the indication regarding the evaluation results includes a performance of the new inspection algorithm compared to the current inspection algorithm.

* * * * *